United States Patent
Sanftleben et al.

(10) Patent No.: US 10,215,142 B2
(45) Date of Patent: Feb. 26, 2019

(54) INJECTOR AND CONTACT ELEMENT FOR THE SAME

(71) Applicant: Continental Automotive GmbH, Hannover (DE)

(72) Inventors: Emanuel Sanftleben, Pfatter (DE); Martin Ploetz, Regensburg (DE); Martin Simmet, Bad Abbach (DE); Steffen Kernbach, Regensburg (DE)

(73) Assignee: CONTINENTAL AUTOMOTIVE GMBH, Hanover (DE)

(*) Notice: Subject to any disclaimer, the term of this patent is extended or adjusted under 35 U.S.C. 154(b) by 303 days.

(21) Appl. No.: 15/031,328

(22) PCT Filed: Oct. 14, 2014

(86) PCT No.: PCT/EP2014/071967
§ 371 (c)(1),
(2) Date: Jun. 8, 2016

(87) PCT Pub. No.: WO2015/058998
PCT Pub. Date: Apr. 30, 2015

(65) Prior Publication Data
US 2016/0281664 A1    Sep. 29, 2016

(30) Foreign Application Priority Data

Oct. 23, 2013 (DE) .................. 10 2013 221 515

(51) Int. Cl.
*F02M 51/00* (2006.01)
*F02M 51/06* (2006.01)
*H01L 41/047* (2006.01)

(52) U.S. Cl.
CPC ...... *F02M 51/005* (2013.01); *F02M 51/0603* (2013.01); *H01L 41/0475* (2013.01)

(58) Field of Classification Search
CPC .............. F02M 51/005; F02M 51/0603; H01L 41/0475
See application file for complete search history.

(56) References Cited

U.S. PATENT DOCUMENTS

| | | | |
|---|---|---|---|
| 4,441,044 A | 4/1984 | Ruckenbauer et al. | 310/338 |
| 5,275,575 A | 1/1994 | Cahaly et al. | 439/188 |

(Continued)

FOREIGN PATENT DOCUMENTS

| | | | | |
|---|---|---|---|---|
| DE | 69307247 T2 | 7/1997 | ........... | H01R 13/639 |
| DE | 102004041170 A1 | 3/2006 | ............. | F02M 51/00 |

(Continued)

OTHER PUBLICATIONS

German Office Action, Application No. 102013221515.0, 5 pages, dated Oct. 23, 2014.

(Continued)

*Primary Examiner* — Sizo Vilakazi
(74) *Attorney, Agent, or Firm* — Slayden Grubert Beard PLLC

(57) ABSTRACT

The present disclosure describes an injector for an internal combustion engine which includes an injector housing, a piezo-actuator control unit having a first set of terminals, a connecting plug on a head of the injector housing, the connecting plug having a second set of terminals, and an electrical connection between the control unit and the connecting plug within the injector housing. The electrical connection comprises a contact element with conductor tracks integrated into an insulating body. The conductor tracks are connected to the terminals of the control unit and of the connecting plug. A first end of the insulating body abuts the control unit or the connecting plug and a second end is spaced from the connecting plug or the control unit. The contact element includes an elastic device by means of which the insulating body is braced against the component it abuts.

9 Claims, 1 Drawing Sheet

(56) References Cited

U.S. PATENT DOCUMENTS

| | | | | |
|---|---|---|---|---|
| 2002/0053342 A1* | 5/2002 | Nozaki | ............... | F02M 51/005 |
| | | | | 123/470 |
| 2004/0020468 A1* | 2/2004 | Cotton, III | ........... | H01R 13/642 |
| | | | | 123/470 |
| 2014/0312252 A1 | 10/2014 | Schmieder et al. | ..... | 251/129.06 |

FOREIGN PATENT DOCUMENTS

| | | | | |
|---|---|---|---|---|
| DE | 102004058715 A1 | | 6/2006 | ............. F02M 51/06 |
| DE | 102005024196 A1 | | 11/2006 | ............. F02M 51/06 |
| DE | 102007055896 A1 | | 6/2008 | ............. F02M 47/02 |
| DE | 102009046311 A1 | | 5/2011 | ............. F02M 51/00 |
| DE | 102009046314 | * | 5/2011 | |
| DE | 102009046314 A1 | | 5/2011 | ............. F02M 51/06 |
| DE | 102011081343 A1 | | 2/2013 | ............. F02M 51/06 |
| EP | 0065511 A1 | | 11/1982 | ................ G01D 5/14 |
| EP | 1630408 A1 | | 3/2006 | ............. F02M 51/00 |
| EP | 1712774 A2 | | 10/2006 | ............. F02M 51/00 |
| EP | 2444650 A1 | | 4/2012 | ............... F02M 1/00 |
| WO | 2015/058998 A1 | | 4/2015 | ............. F02M 51/00 |

OTHER PUBLICATIONS

International Search Report and Written Opinion, Application No. PCT/EP2014/071967, 23 pages, Dec. 1, 2014.

\* cited by examiner

INJECTOR AND CONTACT ELEMENT FOR THE SAME

CROSS-REFERENCE TO RELATED APPLICATIONS

This application is a U.S. National Stage Application of International Application No. PCT/EP2014/071967 filed Oct. 14, 2014, which designates the United States of America, and claims priority to DE Application No. 10 2013 221 515.0 filed Oct. 23, 2013, the contents of which are hereby incorporated by reference in their entirety.

TECHNICAL FIELD

The present invention relates to an injector of an injection system of an internal combustion engine.

BACKGROUND

Some injectors having an injector housing, having a piezo-actuator control unit, having a connecting plug on the head of the injector housing, and having an electrical connection between the control unit and the connecting plug within the injector housing are known. The piezo-actuator control unit is situated close to the nozzle unit. For the electrical contacting of said control unit, a connecting plug is arranged on the head of the associated injector housing. It is therefore necessary for an electrical connection to be provided between the piezo-actuator control unit and the connecting plug in order to supply electrical energy to the control unit. Said electrical connection must be protected against external vibrations of the internal combustion engine and also against internal vibrations of the control unit.

It is known for said electrical connection to be insulated wires, with the piezo-side weld point encapsulated in silicone. Such an electrical connection can be produced only with relatively great outlay, and ultimately constitutes a construction which is susceptible to damage. The process cannot be implemented in a series production context.

SUMMARY

The present disclosure provides teachings which may be used for an injector of the type mentioned in the introduction, distinguished by particularly reliable and robust contact between the piezo-actuator control unit and the connecting plug. In some embodiments, the electrical connection comprises a contact element which has conductor tracks integrated into an insulating body, which conductor tracks are connected to the terminals of the control unit and of the connecting plug, in that one end of the insulating body abuts against the control unit or against the connecting plug and the other end is arranged with a spacing to the connecting plug or to the control unit, and in that the contact element has an elastic device by means of which the insulating body, which abuts against the control unit or against the connecting plug, is braced against the control unit or the connecting plug.

These teachings provide the arrangement of a contact element between the piezo-actuator control unit and the connecting plug, which contact element electrically connects the control unit (the piezo actuator) to the connecting plug in a particularly simple and robust manner. In the contact element, the conductor tracks in the injector body are electrically insulated, wherein the contact element ensures adequate mechanical stability. The elastic device for the bracing action ensures that the connecting point between the contact element and the control unit or the connecting plug is relieved of tension.

The contact element has two conductor tracks (positive and negative polarity of the electrical connection), which, to form the insulating body, may be encapsulated with a plastic. The elastic device for the bracing of the insulating body against the control unit or against the connecting plug protects the corresponding conductor connection points against vibrations, and thereby ensures a high level of durability. By way of the elastic device, the contact element which bears against the control unit or against the connecting plug is braced against the control unit or against the connecting plug with a suitable axial force. The insulating body serves for the electrical insulation of the conductor tracks in the metallic injector body, and at the same time ensures a high level of mechanical stability and good assemblability.

Whereas one end of the insulating body of the contact element bears against the corresponding counterpart element, specifically the control unit or the connecting plug, the other end of the insulating body is arranged with a spacing to the corresponding counterpart element, specifically to the connecting plug or to the control unit. One end of the insulating body bears against the control unit, whereas the other end is arranged with a spacing to the connecting plug. By means of this arrangement or design, thermal changes in length of the contact element, and axial relative movements or vibrations thereof, which are caused as a result of the actuation of the piezo-actuator control unit, are compensated, whereby a reduction in load on the connecting points of the electrical conductors is achieved.

Here a compensation element may employ a double-S-shaped geometry.

If the contact element bears against the control unit, in the event of an increase in length or an axial movement of said contact element, it is possible, owing to the free space provided between the contact element and connecting plug, for said contact element to move in the direction of the connecting plug without this giving rise to corresponding stresses or loads. As a result, the electrical conductor and its connecting points between the contact element and the two counterpart elements are not subjected to significant additional load.

Corresponding length expansions or movements of the contact element are substantially not impeded by the elastic connection between contact element and the associated counterpart element. The elastic device braces the contact element against the counterpart element, e.g., against the control unit, and ensures a stable connection, but on the other hand permits the abovementioned movements or relative movements.

The contact element may comprise a further elastic device for the connection of the insulating body arranged with a spacing to the connecting plug or to the control unit. In this embodiment, therefore, an elastic connecting device is also provided where the end of the contact element is arranged spaced apart from the counterpart element, in order to permit corresponding freedom of movement. This refers to that end of the contact element which is arranged at the connecting plug. Said further elastic device ensures a stabilization of the corresponding connection between the contact element and the counterpart element, and also acts as a tension-relief means, which can compensate different coefficients of thermal expansion and the highly dynamic piezo stroke (axial relative movement with respect to the control unit).

The elastic device for bracing the abutting insulating body may have a spring element which is fixed to the insulating body and to the control unit or to the connecting plug, e.g., to the insulating body and to the control unit. The fixing to the control unit may be realized by virtue of the spring element being locked by engagement thereof into a recess or behind an undercut of the control unit. In this way, the contact element can be quickly and easily fastened to and braced against the control unit, such that said elements can be readily inserted together into the injector housing. The further elastic device, which is used at the other end of the contact element, e.g., a lug or omega-shaped lug, which is fixed to the insulating body and to the connecting plug.

The insulating body not only ensures insulation of the conductor tracks between the control unit and connecting plug but also simultaneously ensures a high level of mechanical stability and good assemblability of the contacting arrangement. Movements of the contact element in a radial direction are prevented in this way.

The conductor tracks of the contact element that are integrated into the associated insulating body may emerge from the insulating body at a face side, and are connected, e.g., welded, to the associated terminals of the connecting plug and of the control unit. The terminals of the connecting plug and of the control unit may be in the form of pins, on the tips of which the corresponding connecting points are provided. To provide space for said connecting points, the insulating body of the contact element may have, on the face side, a recess for receiving the terminals of the control unit or of the connecting plug and for receiving the corresponding connecting points to the conductor tracks of the contact element. In this way, the planar contact between the face side of the insulating body and the counterpart element is not impeded. The insulating body may have a recess of said type on both face sides in order to be able to receive the connecting points both to the control unit and to the connecting plug.

In some embodiments, the radial position of the contact element on the control unit is fixed. In this way, the correct polarity of the conductor tracks during the assembly process is ensured, for example by way of suitable coding of the radial positions of the contact element on the control element or on the piezo actuator.

Some embodiments include a contact element with integrated tension-relief means for the connection of a piezo actuator to a connecting plug in an injector. The contact element ensures protection of the connecting points between the piezo actuator and connecting plug (injection system) against external and internal vibrations. For the production of the contact element, use may be made of standard machine components. It is thus possible to realize an easily configurable design and a good setting of the required axial force. The electrical insulation of the conductor tracks is realized by way of the insulating body of the contact element, wherein, to form the insulating body, an inexpensive process of plastics encapsulation by injection molding may be performed. In this way, potential field failures owing to short circuits or ground connections can be avoided. Furthermore, the insulating body serves to guide the contact element in the injector body.

A high level of flexibility with regard to the required length is possible through the use of exchangeable inserts in the injection-molding and punching tooling.

The present disclosure also relates to a contact element for producing an electrical connection between a piezo-actuator control unit and a connecting plug in an injector of an injection system of an internal combustion engine, which injector has the features described above. Said contact element with insulating body and elastic device for the bracing action ensures particularly reliable and robust contacting between the piezo-actuator control unit (the piezo actuator) and the connecting plug provided on the injector housing head, which connecting plug is connectable to the electrical supply of the system.

BRIEF DESCRIPTION OF THE DRAWINGS

The invention will be discussed in detail below on the basis of an exemplary embodiment in conjunction with the drawing. In the drawing.

DETAILED DESCRIPTION

Figure 1:
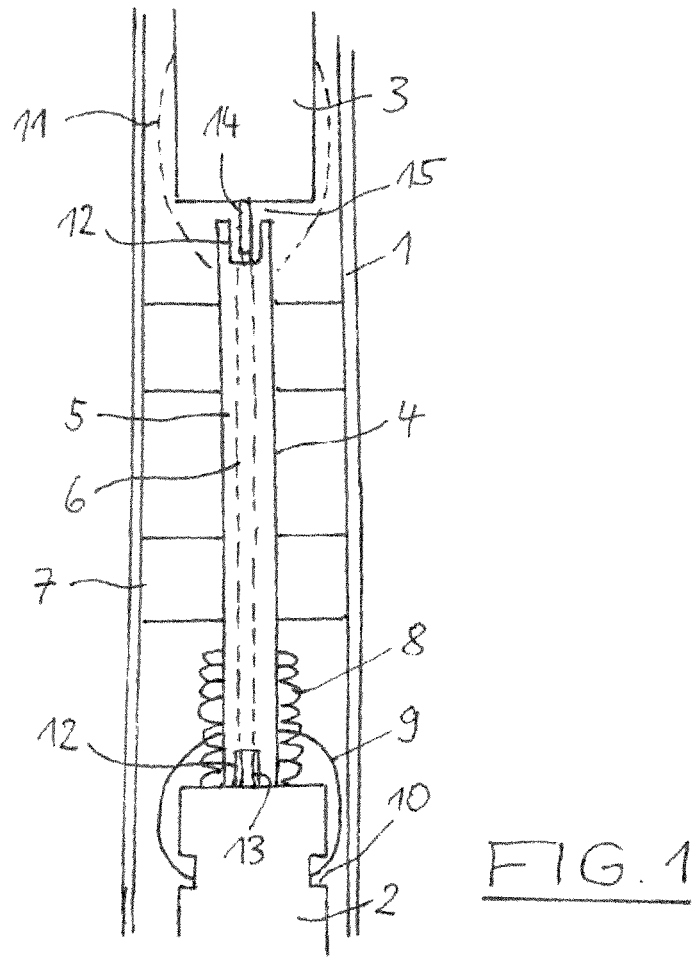
FIG. 1 shows a schematic longitudinal section through a part of an injector body.

FIG. 1 shows a part of an injector body 1 having a piezo-actuator control unit 2 and having a connecting plug 3 arranged on the head of the injector body 1. To permit the actuation of the piezo-actuator control unit 2, the latter has an electrical connection to the connecting plug 3, which in turn has an electrical connection to a control unit of the associated injection system of an internal combustion engine. By actuation of the piezo-actuator control unit 2 by way of electrical impulses, the control unit 2 experiences periodic length expansions and contractions, which effect the injection of fuel via a nozzle mechanism which is not shown.

The electrical connection between the piezo-actuator control unit and the connecting plug 3 is realized by way of a contact element 4 which has conductor tracks 6 integrated into an insulating body 5. In the embodiment illustrated here, two conductor tracks 6 are provided in the insulating body 5, which conductor tracks protrude from the insulating body 5 at a face side, as illustrated. The protruding conductors are arranged in face-side recesses 12 of the insulating body 5, and are welded there to terminals 13, 14 of the control unit 2 and of the connecting plug 3.

The contact element 4 with the corresponding insulating body 5 forms a suitable insulation and guide for the conductor tracks 6, such that said conductor tracks are insulated with respect to the metallic housing of the injector body 1, and furthermore stabilized and protected. Schematically illustrated guide elements 7 on the insulating body 5 ensure the corresponding guidance of the contact element 4 in the injector body 1.

The piezo-actuator control unit 2 thus performs corresponding actuator movements relative to the injector body 1, whereas the connecting plug 3 is fixed to the head of the injector housing 1. To permit the corresponding relative movements between control unit 2 and connecting plug 3, the contact element 4 is designed to be shorter than the spacing between the control unit 2 and connecting plug 3, such that, between the contact element 4 and connecting plug 3, there remains a free space 15 which can accommodate the corresponding length expansions. Said free space can furthermore accommodate temperature-induced changes in length of the system. At the opposite end, the contact element 5 abuts against the head of the control unit 2.

To make it possible to realize secure transitions between the two ends of the contact element 4 and of the control unit 2 and the connecting plug 3, elastic devices 8 and 11 are provided in each case. By way of the elastic device 8, which is a spring element, the contact element 5 is braced against the control unit 2. For this purpose, the spring element 8 is fixed to the insulating body and engages, by way of a clamp 9, behind an undercut 10 provided on the control unit 2. In this way, the contact element 4 is fixed to the control unit 2, wherein the control unit and contact element can perform corresponding movements together, without the electrical connections being impaired as a result. No relative movement between the parts 4 and 2 is admissible. The preload force imparted by 8 must be large enough to prevent relative movements.

An elastic device 11 of said type is also provided at the connection point between contact element 4 and connecting plug 3, wherein said elastic device 11, which may for example be an omega-shaped lug, stabilizes the connection between contact element and connecting plug, without restricting the mobility of the contact element 4 relative to the connecting plug 3.

Figure 2:
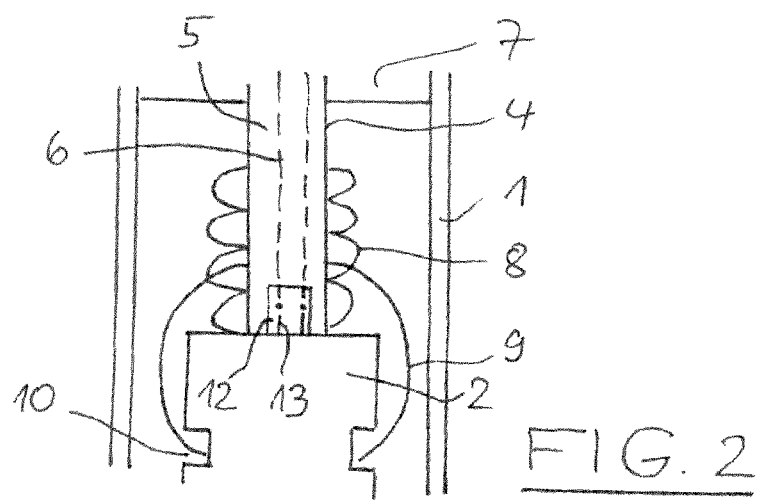
FIG. 2 is an enlarged illustration of the lower part of FIG. 1.

FIG. 2 shows an example connection between contact element 4 and the control unit 2 schematically on an enlarged scale. It can be seen that the recess 12 arranged on the face side in the insulating body 5 of the contact element 4 receives the electrical terminals of the control unit 2 with the connecting points of the conductor tracks 6 of the contact element 4. The elastic device 8 in the form of a spring element with clamp 9 secures the fixing between contact element 4 and control unit 2, while permitting the corresponding movements as discussed above but no relative movements.

The spring element 8 is statically preloaded in order to ensure the corresponding preload force.

The omega-shaped lug need not imperatively be situated between 3 and 5. A two-part insulating body 5 with an interposed compensation lug is also possible.

What is claimed is:

1. An injector for an internal combustion engine, the injector comprising:
    an injector housing,
    a piezo-actuator control unit having a first set of terminals,
    a connecting plug on a head of the injector housing, the connecting plug having a second set of terminals, and
    an electrical connection between the control unit and the connecting plug within the injector housing, the electrical connection comprising a contact element with conductor tracks integrated into an insulating body,
    wherein the conductor tracks are connected to the terminals of the control unit and of the connecting plug,
    wherein in a first end of the insulating body abuts the control unit or the connecting plug and a second end is spaced from the connecting plug or the control unit, and
    wherein the contact element includes an elastic device by means of which the insulating body is braced against the component it abuts.

2. The injector as claimed in claim 1, wherein the contact element comprises a further elastic device for the connection of the insulating body.

3. The injector as claimed in claim 1, wherein the elastic device for bracing the abutting insulating body has a spring element fixed to the insulating body and to the control unit or the connecting plug.

4. The injector as claimed in claim 3, wherein the spring element is locked by engagement thereof into a recess or behind an undercut of the control unit or of the connecting plug.

5. The injector as claimed in claim 2, wherein the further elastic device is an omega-shaped lug fixed to the insulating body and to the connecting plug.

6. The injector as claimed in claim 1, wherein the insulating body of the contact element bears against an internal wall of the housing or against guide elements, and is guided thereby.

7. The injector as claimed in claim 1, wherein the insulating body has, on a face side, a recess for receiving the terminals of the control unit or of the connecting plug and for receiving the corresponding connecting points to the conductor tracks of the contact element.

8. The injector as claimed in claim 1, wherein the radial position of the contact element on the control unit is fixed.

9. An internal combustion engine comprising:
    a combustion chamber,
    a fuel injector feeding fuel into the combustion chamber, the fuel injector comprising:
        an injector housing,
        a piezo-actuator control unit having a first set of terminals,
        a connecting plug on a head of the injector housing, the connecting plug having a second set of terminals, and
        an electrical connection between the control unit and the connecting plug within the injector housing, the electrical connection comprising a contact element with conductor tracks integrated into an insulating body,
        wherein the conductor tracks are connected to the terminals of the control unit and of the connecting plug,
        wherein in a first end of the insulating body abuts the control unit or the connecting plug and a second end is spaced from the connecting plug or the control unit, and
        wherein the contact element includes an elastic device by means of which the insulating body is braced against the component it abuts.

* * * * *